United States Patent
Caskey

[11] Patent Number: 5,922,176
[45] Date of Patent: Jul. 13, 1999

[54] SPARK ELIMINATING SPUTTERING TARGET AND METHOD FOR USING AND MAKING SAME

[75] Inventor: Gregory T. Caskey, Holland, Mich.

[73] Assignee: Donnelly Corporation, Holland, Mich.

[21] Appl. No.: 07/897,870

[22] Filed: Jun. 12, 1992

[51] Int. Cl.$^6$ ................................................ C23C 14/34
[52] U.S. Cl. ............... 204/192.12; 204/192.12; 204/298.11; 204/298.12; 204/298.19; 204/298.21
[58] Field of Search .................. 204/192.22, 192.23, 204/298.12, 298.11, 298.01, 298.02, 298.21, 298.19, 298.2

[56] References Cited

U.S. PATENT DOCUMENTS

| | | | |
|---|---|---|---|
| 3,763,026 | 10/1973 | Cordes | 204/192.23 X |
| 4,356,073 | 10/1982 | McKelvey | 204/192 |
| 4,376,025 | 3/1983 | Zega | 204/298.21 X |
| 4,422,916 | 12/1983 | McKelvey | 204/192 R |
| 4,444,635 | 4/1984 | Kobayashi et al. | 204/192.12 X |
| 4,468,313 | 8/1984 | Okumura et al. | 204/298.12 |
| 4,525,264 | 6/1985 | Hoffman | 204/298.22 |
| 4,904,362 | 2/1990 | Gaertner et al. | 204/298.22 X |
| 4,931,169 | 6/1990 | Scherer et al. | 204/298.19 X |
| 4,946,576 | 8/1990 | Dietrich et al. | 204/298.19 X |
| 5,100,527 | 3/1992 | Stevenson et al. | 204/298.22 |

FOREIGN PATENT DOCUMENTS

| | | | |
|---|---|---|---|
| 0051410 | 11/1986 | Japan | 204/298.21 |
| 0255668 | 10/1989 | Japan | 204/298.22 |
| WO92/02659 | 2/1992 | WIPO | 204/298.21 |

OTHER PUBLICATIONS

Balzers AG for Planar Magnetron Sputtering Sources CPA Series 9900/9930 Sputtering System Operation Manual, CPA Publication No. 9900–01 (Jul. 1985, Circuits Processing Apparatus, Inc., Fremont, California), p. 2–2.

CPA Series 9900/9930 Sputtering System Maintenance Manual, CPA Publication No. 9900–02 (1985, Circuits Processing Apparatus, Inc., Fremont, California), pp. 2–54.

Photonics Spectra, Feb. 1987, p. 127.

Michael W. McBride of Airco Coating Technology, Paper presented at the Society of Vacuum Coaters 33rd Annual Technical Conference in New Orleans, Louisiana, Apr. 1990, one page.

Robert Parsons, *Thin Film Processes II*, J. Vossen and W. Kern, eds., (Academic Press, San Diego, 1991), pp. 194–195.

Robert W. Waits, *Thin Film Processes*, J. Vossen and W. Kern eds., (Academic Press, New York, 1978), pp. 134–135.

*Primary Examiner*—Nam Nguyen
*Attorney, Agent, or Firm*—Van Dyke, Gardner, Linn &Burkhart, LLP

[57] ABSTRACT

The present invention is directed toward reducing catastrophic sparking in various sputtering processes, and especially reactive DC magnetron sputtering processes. Nonsparking sputtering targets and methods for making such targets having regions of sputtering and nonsputtering are disclosed in both planar and cylindrical forms wherein various means for electrically insulating the nonsputtered regions of the target from the sputtering gas plasma are provided. The means for insulating includes covering the regions of nonsputtering with an electrically insulating material. Corresponding methods of eliminating or substantially reducing such sparking are disclosed whereby various nonsparking planar and cylindrical targets are utilized in conventional DC magnetron reactive sputtering processes. Alternately, or in combination with particular nonsparking targets, the present invention includes alterations to the sputtering chamber to alleviate such sparking. Furthermore, the present invention is also directed toward DC reactive magnetron sputtering of either a planar or a rotatable, cylindrical target containing silicon, wherein the target is sputtered in an atmosphere containing oxygen.

10 Claims, 5 Drawing Sheets

SPARK ELIMINATING SPUTTERING TARGET AND METHOD FOR USING AND MAKING SAME

BACKGROUND OF THE INVENTION

Sputtering is a thin film coating process which involves the transport of almost any material from a target to a substrate of almost any other material. The ejection of the target material is accomplished by bombarding the surface of the target with gas ions accelerated by a high voltage. Particles of atomic dimension are ejected from the target as a result of momentum transfer between the accelerated gas ions and the target. Upon ejection, the target particles traverse the sputtering chamber and are subsequently deposited on a substrate as a thin film.

Sputtering processes utilize an enclosed chamber confining a sputtering gas, a target electrically connected to a cathode, a substrate, and a chamber which itself may serve as the electrical anode. A power supply is typically connected such that the negative terminal of the power supply is connected to the cathode and the positive terminal is connected to the chamber walls. In operation, a sputtering gas plasma is formed and maintained within the chamber near the surface of the sputtering target. By electrically connecting the target to the cathode of the sputtering power supply and creating a negative surface charge on the target, electrons are emitted from the target. These electrons subsequently collide with atoms of the sputtering gas, thus stripping away electrons from the gas molecules creating positively charged ions. The resulting collection of positively charged ions together with electrons and neutral atoms is herein referred to as a sputtering gas plasma. The positively charged ions are accelerated toward the target material by the electrical potential between sputtering gas plasma and target and bombard the surface of the target material. As ions bombard the target, molecules of target material are ejected from the target surface and coat the substrate.

One method of enhancing conventional sputtering processes is to arrange magnets behind or near the target to influence the path taken by electrons within the sputtering chamber, thereby increasing the frequency of collisions with sputtering gas atoms or molecules. Additional collisions create additional ions, thus further sustaining the sputtering gas plasma. An apparatus utilizing this enhanced form of sputtering by means of strategically located magnets is referred to herein as a magnetron system.

When attempting to form thin, electrically insulating layers by sputtering electrically insulating target materials such as various oxide (e.g. silicon dioxide) or nitride compounds, the insulative nature of such target materials prevents DC magnetron sputtering from occurring. However, it has been found that the insulating layer may be reactively formed on the substrate by sputtering the electrically conductive base element (e.g. silicon) with a reactive gas (e.g. oxygen or nitrogen). This approach of forming a compound film on the substrate is referred to herein as reactive sputtering.

One drawback encountered in sputtering processes (reactive and nonreactive) is the creation of sputtered regions and nonsputtered regions on sputtering targets. For example, in DC magnetron sputtering processes, sputtered regions arise from the particular arrangement of magnets near the magnetron sputtering cathode and target. For a planar target which has been at least partially sputtered, a sputtered region typically appears as an oval or racetrack-shaped depression on the target surface. The rest of the target surface where sputtering does not substantially occur is herein referred to as nonsputtered region(s). For a nonrotating cylindrical magnetron target, the sputtered region would also typically appear as an oval or racetrack-shaped depression on the target surface, depending upon the particular arrangement of magnets near the target. However as most cylindrical targets are rotated about their cylindrical axis during sputtering, a uniform region of sputtering results over a portion of the length of the target. Remaining nonsputtered regions then typically comprise the distal ends.

As reactive sputtering takes place, often a thin layer of the reacted target material (usually nonconductive) builds up in the nonsputtered regions of the target as well as upon other exposed components inside the chamber. In the example of a silicon target sputtered in an oxygenated environment, a thin layer of silicon dioxide (an insulator) will form over the entire target surface, in both sputtered regions and nonsputtered regions. However, where the layer forms in sputtered regions, it is immediately sputtered off the target surface and ejected back into the sputtering chamber. In this manner, a thin insulating layer eventually builds up on the target surface only in the nonsputtered regions.

When a sputtering gas plasma forms near the insulating layer deposited in the nonsputtered regions of the target surface, sparking through the insulating layer to the target surface may occur. As the sputtering gas plasma builds up charge on the outer surface of the insulating layer, the electrical potential across the insulating layer increases. When this potential equals or exceeds the breakdown voltage across the thickness of the deposited insulating layer, sparking occurs through the insulating layer to the underlying target material. Once a spark develops, target matter is evaporated. This increases the ion density near the spark, which further propagates the spark. Eventually most of the cathode power is dissipated by such sparks, thus resulting in catastrophic sparking as referred to herein.

If the insulating layers were allowed to build up to sufficient thicknesses, eventually the breakdown voltage of the layer would be greater than the maximum voltage encountered in the sputtering environment, and sparking would not occur. However, it is the initial stages of build up of the insulating layer that are most critical since the voltages present in the sputtering environment are sufficient to spark through the thin insulating layer. For some silicon/aluminum targets reactively sputtered in an oxygenated environment, the resulting thin oxide layers which build up on the target surface may begin sparking after only a few hours of operation. When sparking occurs, coating quality is compromised owing to variations in the rate of coating, particularly for sputtering processes which pass a moving substrate beneath the target. Moreover, sparks tend to produce flaking of material off internal coater surfaces, which then land on the substrate and obscure further coating. Sparking, therefore, significantly reduces sputtering efficiency, tends to prematurely destroy sputtering targets, and prevents economical sputter coating over sustained time periods.

Thus, the need exists for a sputtering target which is significantly less susceptible to catastrophic sparking than prior known targets. Methods of reducing catastrophic sparking on target surfaces are also desired. Moreover, methods of producing and using nonsparking targets, and especially of magnetron type, either in planar or cylindrical form, are desired.

SUMMARY OF THE INVENTION

The present invention provides substantially nonsparking sputtering targets, a means for reducing catastrophic sparking on target surfaces, and methods of forming substantially nonsparking sputtering targets. More particularly, the present invention remedies the difficulties encountered with the prior art in attempting to reactively sputter silicon, silicon alloys or composites over extended periods of time.

In particular, the present invention comprises a nonsparking, sputtering target for use preferably in reactive DC magnetron sputtering processes. The target may be formed or modified to include a backing member, which provides structural form and rigidity, and/or electrical contact, having a layer of target material deposited thereon, and a means for electrically insulating the nonsputtered regions of the target from a sputtering gas plasma which forms during the sputtering operation. The present invention also encompasses various embodiments of sputtering targets including multilayer planar forms and cylindrical forms.

Moreover, the present invention includes methods of reducing sparking during reactive sputtering by insulating in various ways, the nonsputtered regions on both planar and cylindrical targets from the sputtering gas plasma. The insulation may be applied to an existing target, formed in conjunction with the target itself, or result from means external to the target.

Thus, by use of the present invention with sputtering processes, and especially reactive DC magnetron sputtering processes, both planar and cylindrical sputtering targets are provided which are immune from or dramatically less susceptible to catastrophic sparking. This feature allows for much longer continuous time periods of reactive sputtering, higher power operation of sputtering targets with concomitant higher deposition rates, increased sputtering efficiency (in both the physical and economical sense) and guards against the premature destruction of sputtering targets. Furthermore, such enhancements may be readily conveyed to conventional sputtering processes by use of targets modified or formed in accordance with the teachings herein, or by making minor modifications to the sputtering chamber, or by a combination of the two.

DESCRIPTION OF THE PREFERRED EMBODIMENT

Figure 1:
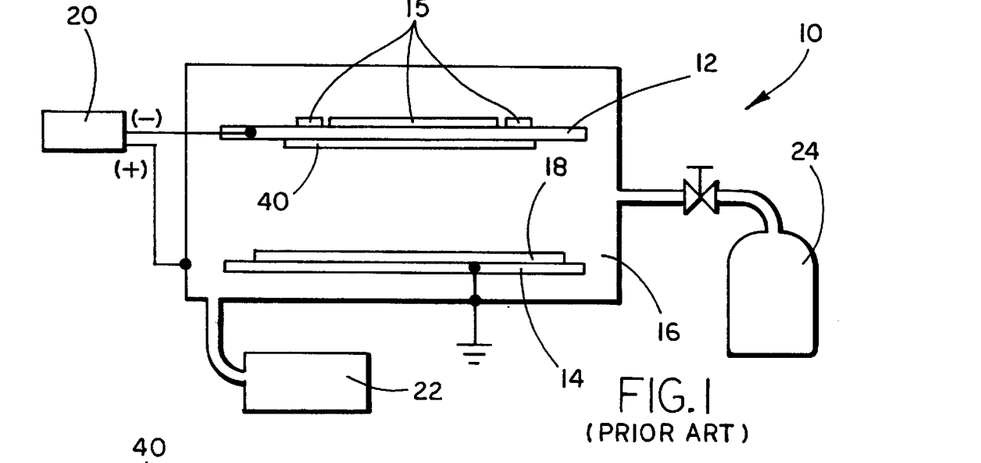
FIG. 1 is a simplified schematic illustration of a conventional reactive DC magnetron sputtering apparatus and target.
Figure 15:
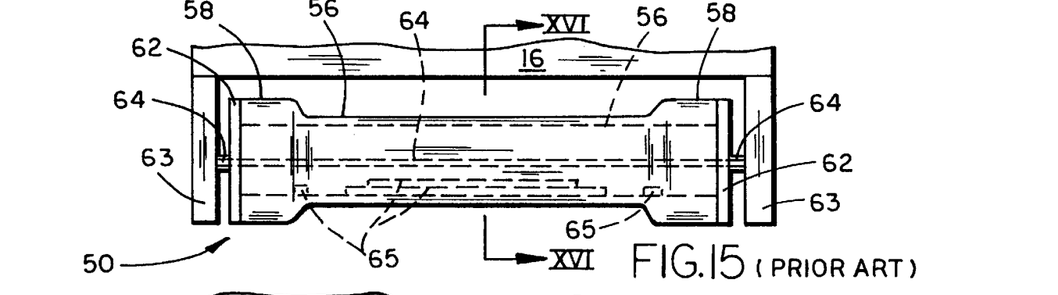
FIG. 15 is a side elevational view of a conventional cylindrical, magnetron sputtering target, after sputtering, illustrating the orientation of interior magnets.
Figure 16:
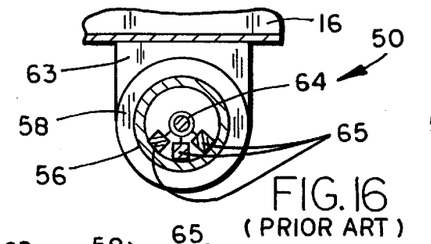
FIG. 16 is a cross section of the target of FIG. 15 taken along plane XVI—XVI, after sputtering.
Figure 17:
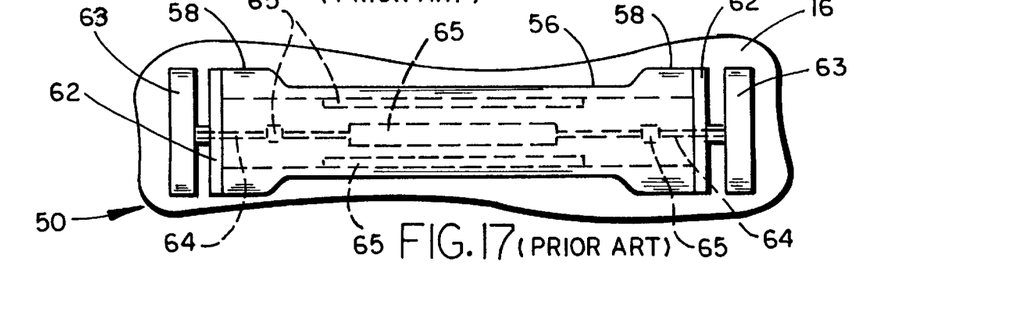
FIG. 17 is an elevational view of the underside of the target of FIG. 15 illustrating the orientation of interior magnets.

A typical sputtering apparatus 10 for sputtering thin films or coatings on a substrate 18 is illustrated in FIG. 1. Apparatus 10 typically includes a sputtering chamber 16, a vacuum means 22 to evacuate the chamber, a sputtering target such as a planar target 40 as illustrated in FIGS. 2–5 or a cylindrical target 50 as illustrated in FIGS. 15–17, one or more magnets designated as 15 in FIG. 1. 65 in FIGS. 15–17, 65a in FIGS. 18–19, and 65c in FIGS. 23–24, a supply of sputtering gas 24, a power supply 20 having a positive terminal and a negative terminal, and means 14 to support and/or transport the substrate in the deposition region of the chamber. The target is typically electrically connected to cathode 12. Cathode 12 is typically electrically connected to the negative terminal of power supply 20. The sputtering chamber 16 is sometimes the electrical anode. Alternately, a separate anode element may be introduced inside the sputtering chamber and may even be connected to its own power supply so as to be at some set potential, other than ground, with respect to cathode 12. Typically, the sputtering chamber 16 is at ground potential, and in some instances may be connected to the positive terminal of the power supply. Usually, the target is at the most negative potential of any of the components of the sputtering apparatus (besides the negative terminal of the power supply). It is understood that a host of combinations of electrical connections may be made between the power supply 20 and various components of the sputtering apparatus 10.

The selection of power supply 20 depends upon the target material and the type of sputtering to be employed. The typical types of power supply 20 include direct current (DC) or radio frequency (RF). DC sputtering is frequently used when sputtering conductive or semiconductive target materials. RF sputtering may be used for conducting or nonconducting target material. Advantages of DC sputtering over RF sputtering include a higher rate of sputtering, lower operating expense, easier use, and less complexity of sputtering hardware.

Once the sputtering chamber 16 has been evacuated to the desired vacuum level by vacuum means 22, a sputtering gas 24 is metered into chamber 16. In certain sputtering processes the sputtering gas 24 may be an inert gas such as argon, neon, etc. Other forms of sputtering processes known as reactive sputtering (described below) may utilize reactive noninert gases such as oxygen or nitrogen. In addition, some sputtering operations may utilize a mixture of one or more inert gases and/or noninert gases.

Figure 2:
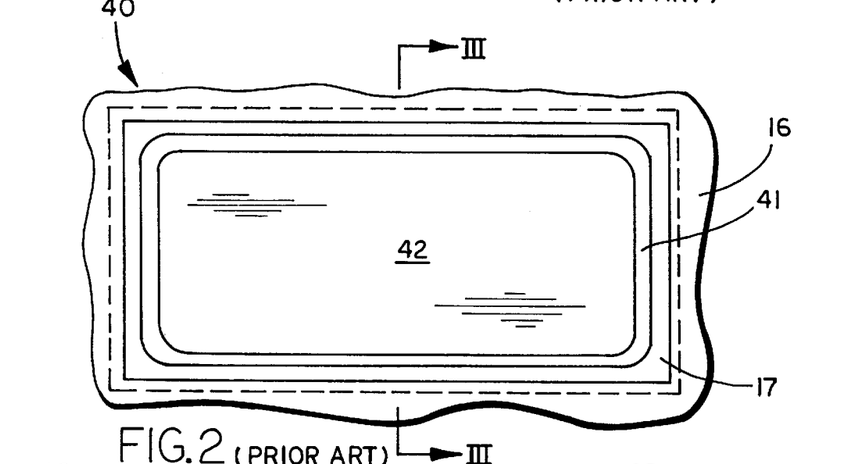
FIG. 2 is a top plan view of a conventional, planar sputtering target before sputtering.
Figure 3:
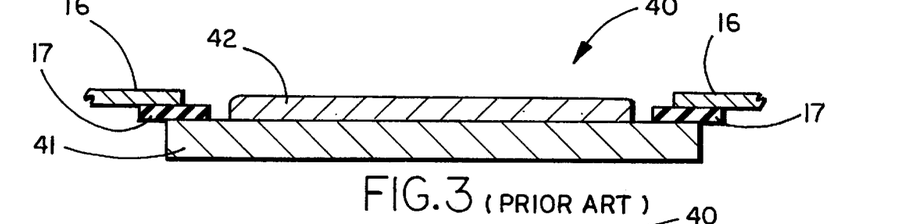
FIG. 3 is a cross section of the sputtering target of FIG. 2 before sputtering, taken along plane III—III.

The sputtering target provides the material which is to be deposited onto the substrate. The size, shape and construction of the target may vary depending upon the material and the size and shape of the substrate. A typical planar sputtering target 40 before sputtering is shown in FIGS. 2–3 and comprises an electrically conducting backing plate 41 and a layer of electrically conducting target material 42 deposited thereon. Electrical insulator 17 is preferably employed to cover any exposed region of backing member 41 or other underlying surface. Typically, the chamber walls 16 will abut insulator 17 and extend up to, but not contact the target material 42. Backing member 41 is not necessary for target materials which are inherently rigid or of sufficient thickness. Thus, in such instances, the target material itself may also serve as the backing member. Exemplary target materials which generally do not require a backing member include titanium, copper, chromium, vanadium and aluminum. Exemplary target materials which generally require a backing member include silicon; most insulators such as tantalum pentoxide, silicon dioxide and aluminum oxide, due to their brittleness; thin coatings of target materials; and precious metals.

A typical cylindrical magnetron target 50 after sputtering is illustrated in FIGS. 15–17. In conventional cylindrical, magnetron sputtering targets, the target material is in the form of a rotatable, hollow cylinder having a spindle 64 passing through its interior. Spindle 64 is usually hollow and provides a fluid path for cooling water which is often circulated within the interior of target 50. The cylindrical target is generally supported at both of its ends by support means 63 which in turn are attached to the sputtering chamber 16. Insulating end members 62 may be provided at one or both ends of the cylindrical target. Positioned in the interior of the cylinder are a plurality of magnets 65 which affect the shape of the sputtered regions along the target. FIG. 17 particularly illustrates one possible arrangement of magnets 65 within the cylindrical target. Cylindrical targets may be formed from an electrically conducting cylindrical backing member having an outer layer of electrically conducting target material. Alternatively, cylindrical targets may be formed from solid or semisolid electrically conducting target material stock, such as aluminum tubing. With the appropriate choice of power supply, sputtering apparatus, and process, nearly any material may be sputtered.

Figure 4:
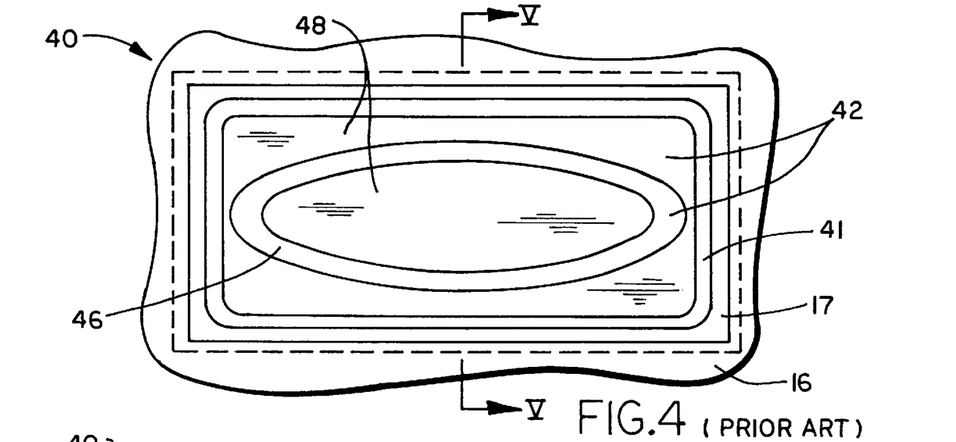
FIG. 4 is a top plan view of a conventional planar magnetron sputtering target after sputtering, illustrating regions of sputtering and nonsputtering.
Figure 5:
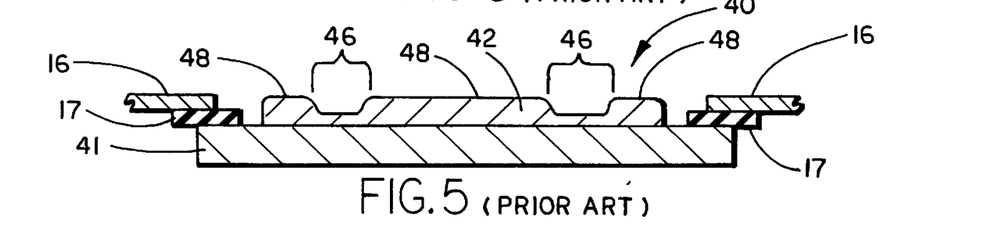
FIG. 5 is a cross section of the sputtering target of FIG. 4. taken along plane V—V.

FIGS. 4–5 illustrate the planar sputtering target 40 of FIGS. 2–3, after sputtering, and when planar sputtering target 40 is of the magnetron type. Soon after the initial onset of sputtering, regions of sputtering 46 and nonsputtering 48 will appear on the surface of target material 42. The outline of sputtered region 46 varies from one magnetron sputtering apparatus to another, as such outlines are influenced by the particular arrangement of magnets near the cathode and target. In this case, the sputtered region is shown as an oval or racetrack pattern. The depth of depressions or valleys formed in target material 42 is generally proportional to the time period of the sputtering operation.

The present invention is embodied in planar and cylindrical forms of sputtering targets useful in the above type of sputtering apparatus. The preferred forms of the targets of the present invention are shown in FIGS. 6–14 and 18–24, and referenced by items 40a, 40b, 40c, 50a, 50b, and 50c. The present invention is also directed toward methods for reducing catastrophic sparking during reactive sputtering processes, particularly of the DC type and of the magnetron type, and methods of manufacturing substantially nonsparking sputtering targets, particularly of the DC type and of the magnetron type.

Figures 6, 7:
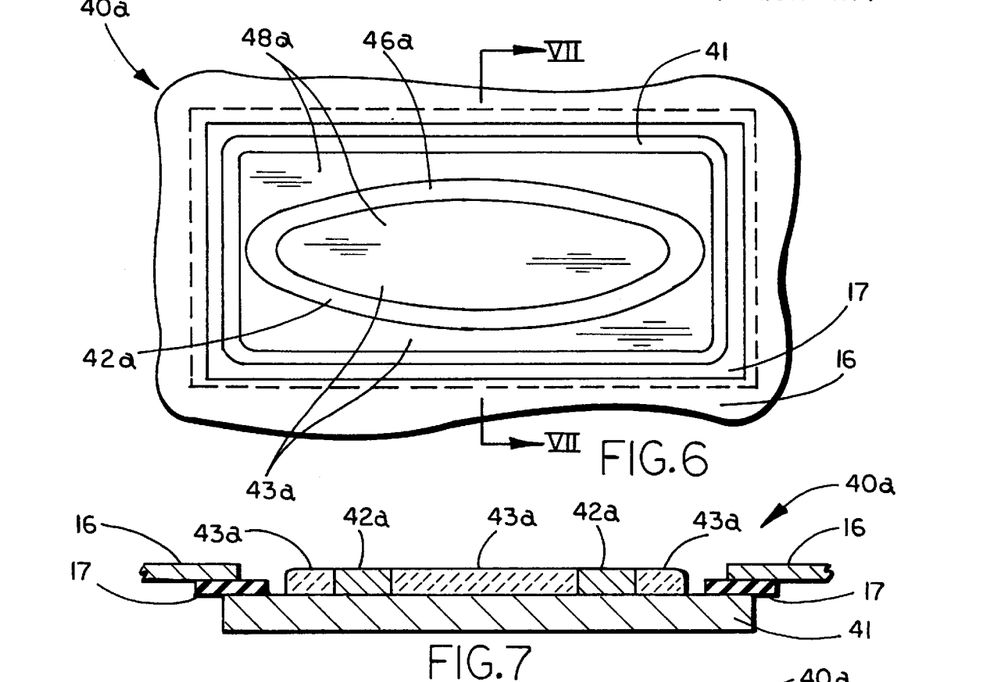
FIG. 6 is a top plan view of a first embodiment of the planar magnetron sputtering target of the present invention, before sputtering.
FIG. 7 is a cross section of the sputtering target of FIG. 6 before sputtering, taken along plane VII—VII.
Figure 8:
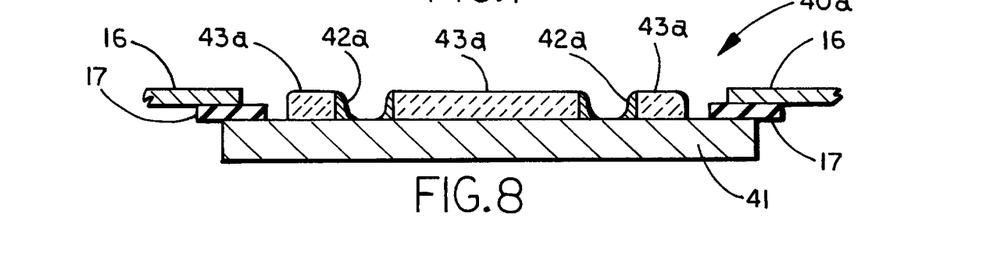
FIG. 8 is a cross section of the sputtering target of FIG. 6 after sputtering, taken along plane VII—VII.

FIG. 6 illustrates a top plan view of a first embodiment 40a of the sputtering target 40 wherein sputtering target 40a is of the planar magnetron type including electrically conducting target material 42a and insulating material 43a, both residing upon electrically conducting backing member 41, the backing member preferably forming a cathode. During early phases of sputtering, at least one sputtered region 46a and at least one nonsputtered region 48a will be defined on the target surface. The first embodiment 40a of the present invention requires that target material 42a and insulating material 43a reside in particular locations on the cathode backing member 41 such that the target material 42a substantially only resides in the sputtered region 46a of the target and the insulating material 43a substantially only resides in the nonsputtered regions 48a of the target. Before sputtering, as shown in FIG. 7, the target material 42a in region 46a and the insulating material 43a in regions 48a are co-planar and define an oval or racetrack design which, as noted above, is a typical geometric pattern for planar magnetron targets. The sputtering target of FIG. 7 after sputtering is illustrated in FIG. 8 where a portion of the target material 42a has been sputtered from the sputtered region 46a, thereby forming an oval or racetrack-shaped depression or valley on the target surface. In all embodiments, regions of backing members or other structures will also be at sputter-cathode potential (voltage). Sparking can also occur in those regions if insulating films build up and a sputtering gas plasma is nearby. Therefore, exposed surfaces at cathode potential must be shielded from the sputtering gas plasma just as other non-sputtered regions are shielded herein. Usually, those exposed regions are covered by shields not shown in FIGS. 1–24, and so no special shielding is required. However, it is understood by simple extension that the methods herein disclosed can also be used in such exposed regions if necessary.

The first embodiment 40a of the planar magnetron sputtering target may be formed by modifying a conventional planar target 40 shown in FIGS. 2–3, having a layer of target material 42 contacting cathode backing member 41. Alternatively, a conventional planar target may be formed by applying a target material such as 6% aluminum and 94% silicon to a copper backing plate. Such target material is available from Cookson-Plasmaterials, Inc. of San Ramon, Calif. The aluminum is added to increase the electrical conductivity of the otherwise semiconducting silicon for better sputtering operation. The first step of altering the conventional target 40 is determining the regions of sputtering and nonsputtering. This may be done by sputtering a target of identical geometry in the sputtering apparatus to be used. After sputtering of target material occurs, regions of sputtering will become visible. This pattern then forms the outline for future reference of sputtered and nonsputtered regions for the particular combination of target and sputtering apparatus.

Referring to FIG. 6, after determining the particular outline of nonsputtered region 46a, the target material 42a in region 46a is removed by appropriate machining techniques. Preferably, the target material is removed entirely in the nonsputtered regions and slightly beyond the border between the nonsputtered and sputtered region. The present inventor has found that if target material in the sputtered region, lying within ¼ inch of the border between regions, is removed and the regions of removal subsequently replaced with insulating material, the chance of sparking occurring during sputtering is further minimized. The removed target material 42a is replaced with an insulating material 43a such as a castable ceramic cement. An example of a castable ceramic cement is PYROMAX ceramic from Aremco Products of Ossining, N.Y. Outer regions where target material is removed may require the use of an edge mold or form around the perimeter of the target to retain the liquid castable ceramic before and while it cures. It is most preferred, but not required, to remove all target material in the nonsputtered regions of the target thereby exposing the backing member to permit better bonding of the ceramic to the backing member.

Figure 9:
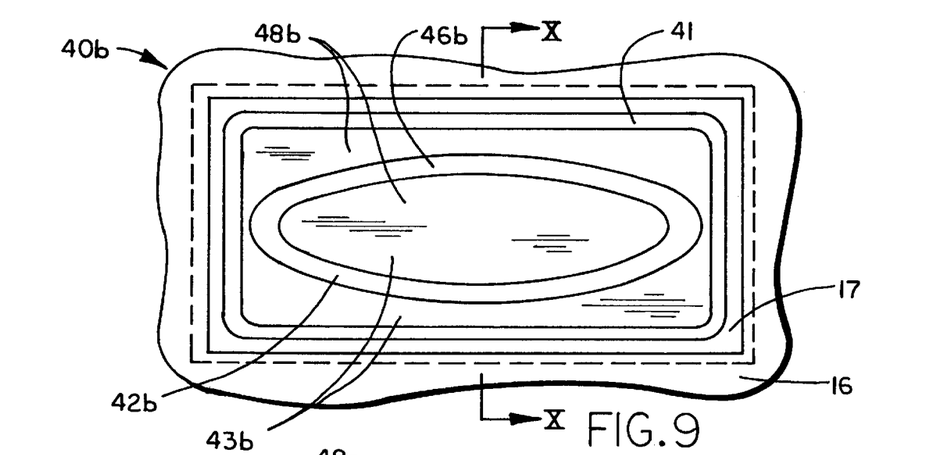
FIG. 9 is a top plan view of a second embodiment of the planar magnetron sputtering target of the present invention, before sputtering.
Figure 10:
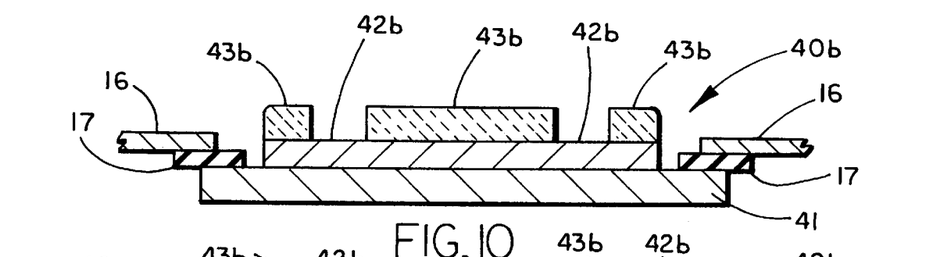
FIG. 10 is a cross section of the sputtering target of FIG. 9 before sputtering, taken along plane X—X.
Figure 11:
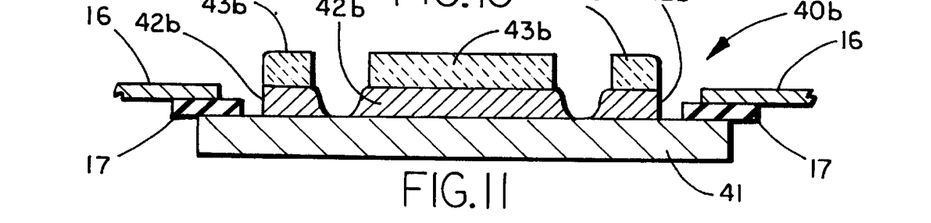
FIG. 11 is a cross section of the sputtering target of FIG. 9 after sputtering, taken along plane X—X.

FIG. 9 is a top plan view of a second embodiment 40b of the planar magnetron sputtering target comprising a first layer of electrically conducting target material 42b contacting substantially one entire face of cathode backing member 41, and a second layer of insulating material 43b contacting target material 42b primarily in regions of nonsputtering 48b. As illustrated in FIG. 9, target material 42b is only visible in sputtered region 46b. Before sputtering as shown in FIG. 10, the surface of target material 42b in region 46b is uniform, even and generally planar, but recessed below the surface of insulating material 43b in the usual oval racetrack pattern. FIG. 11 illustrates the sputtering target 40b after sputtering, where a similar sputtered pattern results as in target 40a.

The second embodiment 40b of the planar magnetron sputtering target may be formed by obtaining a conventional planar sputtering target 40 illustrated in FIGS. 2–3, and determining those regions of sputtering and nonsputtering by the manner described herein. Referring to FIGS. 9 and 10, after determining the nonsputtered regions 48b, an electrically insulating material 43b is deposited and bonded to the outer surface of target material 42b in the nonsputtered regions 48b. Typically, the electrically insulating material will adhere to the adjoining surfaces, however it is envisaged that an adhesion promoting layer such as a suitable solder or adhesive could be utilized depending upon the application requirements. Examples of preferred electrically insulating material 43b include PYROMAX castable ceramic or No. 29 low expansion ceramic cement from Sauereisen Cement Co. of Pittsburgh, Pa.

Figure 12:
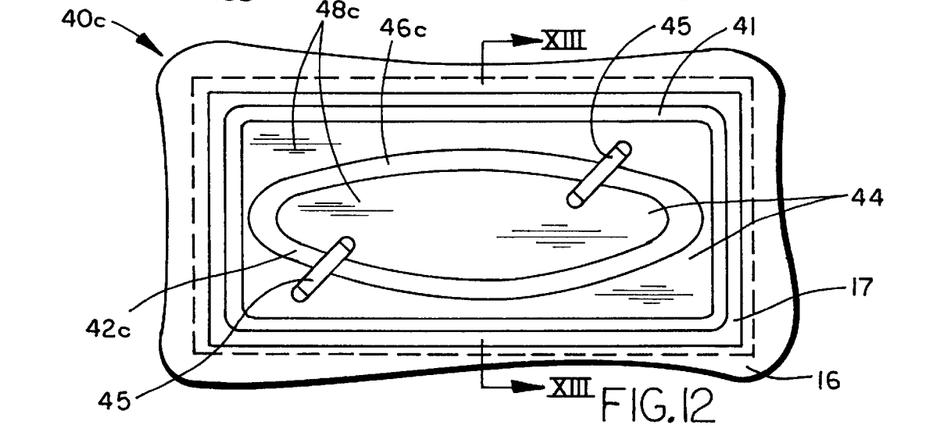
FIG. 12 is a top plan view of a third embodiment of the planar magnetron sputtering target of the present invention, before sputtering.
Figure 13:
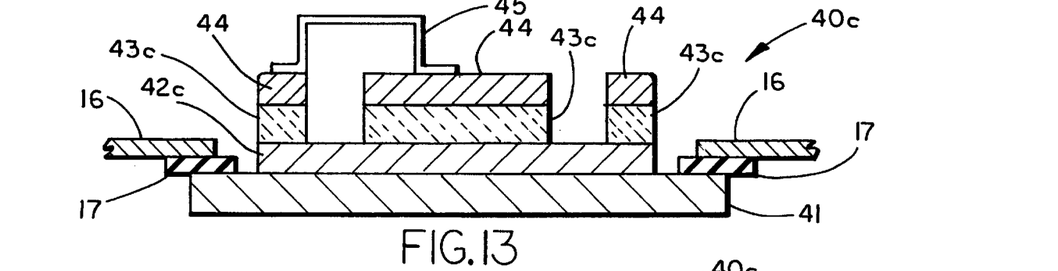
FIG. 13 is a cross section of the sputtering target of FIG. 12 taken along plane XIII—XIII, before sputtering.
Figure 14:
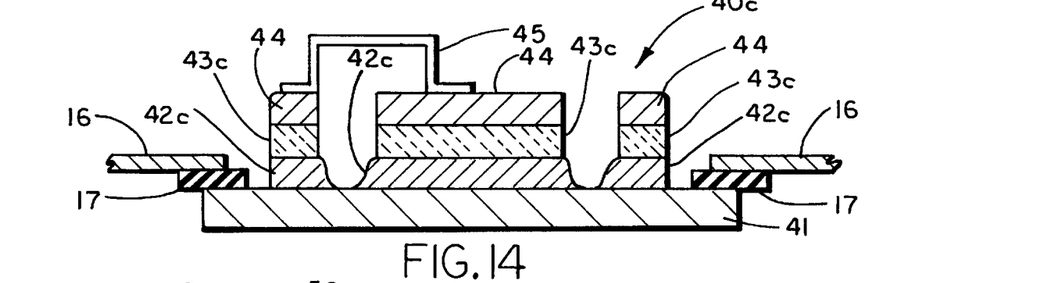
FIG. 14 is a cross section of the sputtering target of FIG. 12 taken along plane XIII—XIII, after sputtering.

FIG. 12 illustrates a third embodiment 40c of the planar magnetron sputtering target comprising a first layer of electrically conducting target material 42c contacting substantially one entire face of cathode backing member 41, a second layer of insulating material 43c contacting target material 42c primarily in regions of nonsputtering 48c, a support material 44 positioned upon and contacting the outer surface of insulating material 43c, and at least one mounting arm 45. Insulating material 43c may or may not be fully or in part secured or adhered to target material 42c. One or more mounting arms 45 may extend between the interior nonsputtered region 48c and peripheral nonsputtered region 48c to provide support for the interior nonsputtered region. The sputtering target 40c differs from the second embodiment sputtering target 40b by the incorporation of a layer of support material 44 and one or more mounting arms 45 which support insulating material 43c without requiring that material to be attached to the target. In those instances where good adhesion between target material and insulating material is not possible, the third embodiment 40c is preferred over the second embodiment 40b. As in target 40b, before sputtering, target 40c (FIG. 13) includes a uniform, even, generally planar surface in region 46c which is recessed below the surface of insulating material 43c and support material 44. FIG. 14 is a cross section of the sputtering target of FIG. 12 after sputtering showing target erosion in the typical oval or racetrack pattern with depressions or valleys being visible.

The third embodiment 40c of the planar magnetron sputtering target may be formed in part by the same manner as the second embodiment 40b. The choice of material for insulating material 43c includes the materials noted for insulating material 43b in the second embodiment 40b, and may further include appropriately cut glass sheets. Once having formed the second embodiment sputtering target 40b, the support material 44 is cut into the appropriate shape(s) corresponding to nonsputtered regions 48c. The support material 44 is preferably metal. The support material is most preferably metal coated with a castable ceramic which is subsequently cured. An example of such a ceramic is PYROMAX. The resulting cut shapes of support material 44 are then contacted to the outer surface of insulating material 43c and secured by one or more mounting arms 45. The support material may be bonded to the insulating material if desired. If sheets of metal coated with a castable ceramic are utilized for the support material, the inherent bonding tendency of the castable ceramic will in most cases be sufficient. Alternately, or in combination with the castable ceramic, an adhesion promoting layer may be utilized as in the second embodiment 40b. Mounting arms 45 are preferably formed from metal. Mounting arm 45 may be affixed to the support material 44 in a variety of ways such as by adhesives or mechanical fasteners. If mechanical fasteners are used, it is important that none of the fasteners extend through the support material 44 and substantially through the underlying insulating material 43c. It is also important that the mounting arms 45 extend outward from the outermost surface of support material 44 substantially away from the region where the most intense sputtering gas plasma is formed during sputtering. Preferably, mounting arm 45 is generally U-shaped, comprising two end members and an intermediate traversing portion. When the preferred form of mounting arm 45 is affixed to the support material, the intermediate traversing portion is oriented generally parallel to the support material. The minimum linear distance between the traversing portion of mounting arm 45 and the support material, along a line perpendicular to the support material, should be substantially greater than the distance at which sputtering gas plasma is formed near the exposed surface of the support material. This practice minimizes any interaction between a mounting arm and the sputtering gas plasma. The mounting arms 45 are, in turn, supported from the interior of a sputtering apparatus such as that at 10 in FIG. 1. It is not necessary to electrically insulate the support means between the sputtering chamber and the mounting arm. However, such practice could be performed if desired.

Sputtering processes are envisaged in which the planar sputtering target 40c is orientated such that the respective layers of target material 42c, insulating material 43c, and support material 44 merely lay upon one another due to gravity. In this instance, it would not be necessary to provide a support means from the sputtering chamber to the mounting arms, and furthermore in this instance, it may be possible to eliminate the mounting arms altogether.

The thicknesses of insulating materials 43a, 43b, and 43c in embodiments 40a, 40b, and 40c respectively, depend upon the voltages encountered near the sputtering target and the dielectric strength of the insulating material selected. Typical voltages in a magnetron sputtering environment range from approximately 10 volts to several hundred volts. Therefore, if an insulating material having a dielectric strength of 100,000 V/cm were utilized for insulating material 43a, 43b, or 43c, and the maximum voltage expected in the sputtering environment was 200V, the minimum thickness of the insulating material should be approximately 20 microns. The maximum voltage encountered within the sputtering environment may be estimated by the electrical potential between the power supply cathode and the walls of the sputtering chamber.

The present invention is not limited to the particular outlines of sputtered regions 46a, 46b and 46c, and non-sputtered regions 48a, 48b and 48c of embodiments 40a, 40b and 40c, illustrated in FIGS. 6, 9 and 12 respectively. The teachings of the present invention are equally applicable to sputtered and nonsputtered regions of other shapes which may form on various target surfaces.

Figure 18:
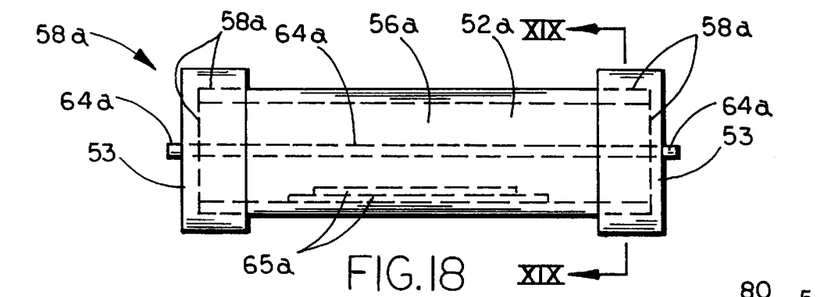
FIG. 18 is a side elevational view of a fourth embodiment of the present invention, namely, a cylindrical magnetron sputtering target with insulating circular members.
Figure 19:
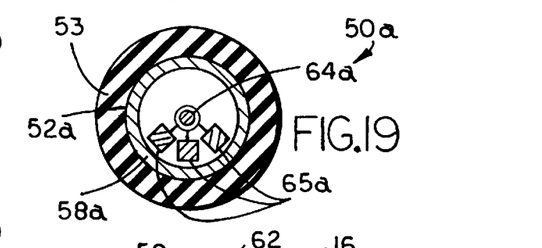
FIG. 19 is a cross section of the sputtering target of FIG. 18 taken along plane XIX—XIX.

The present invention also pertains to cylindrical sputtering targets, as such targets are also susceptible to catastrophic sparking. FIGS. 18–19 illustrate a fourth embodiment 50a of the cylindrical magnetron sputtering target comprising an electrically conducting target material 52a in the form of a hollow cylinder having sputtered region 56a and nonsputtered regions 58a, a plurality of magnets 65a arranged within the interior of the cylinder, a spindle 64a extending outward from one or both ends of the cylinder, and at least one insulating circular member 53 which is placed over at least one nonsputtered region 58a. The width of circular member 53 should be sufficient to adequately cover the nonsputtered regions of the target. Preferably, when positioned over the cylindrical target and nonsputtered region, circular member 53 extends no more than about $\frac{3}{16}$ to about $\frac{1}{4}$ inch beyond the nonsputtered region into the sputtered region. Insulating circular member 53 should have an internal diameter such that it may be positioned over one end of the cylindrical target, yet be frictionally retained. If desired, a nonconducting flexible material such as cloth, tape or foil may be wrapped around one or both cylindrical target ends, in the nonsputtered regions, to a thickness sufficient to frictionally retain circular member 53. An example of suitable flexible material is KAPTON foil by Fralock, Inc. of Calif. Before sputtering, the cylindrical target has a larger diameter than after sputtering in the region of sputtering 56a.

Figures 20, 21:
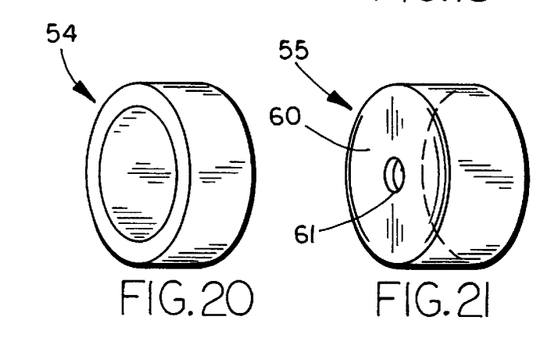
FIG. 20 is an oblique view of an insulating ring for use with a cylindrical magnetron sputtering target in accordance with the fourth embodiment of the present invention.
FIG. 21 is an oblique view of an insulating cap for use with a cylindrical magnetron sputtering target in accordance with the fourth embodiment of the present invention.

FIG. 20 illustrates a first embodiment of the insulating circular member 53 in which circular member 53 is in the form of a ring 54 having two open ends. An example of ring 54 is a 902 machinable ceramic ring having a $\frac{1}{4}$ inch wall thickness, from Cotronics, Inc. of Brooklyn, N.Y. FIG. 21 illustrates a second embodiment of circular member 53 in which circular member 53 is in the form of a cap 55 having one substantially closed end 60, which in addition may contain an optional spindle access aperture 61 for spindles which support and/or rotate target 52a.

Figure 22:
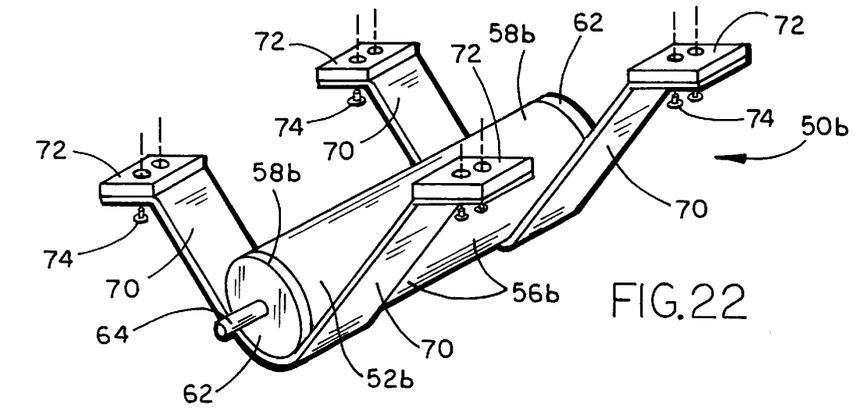
FIG. 22 illustrates a fifth embodiment of the present invention, namely, a cylindrical magnetron sputtering target in conjunction with insulating shields.

FIG. 22 illustrates a fifth embodiment 50b of the present invention comprising an electrically conducting, cylindrical sputtering target 52b having sputtered region 56b and nonsputtered regions 58b, one or more shields 70 placed over the nonsputtered regions 58b of the cylindrical sputtering target 52b, and one or more isolation pads 72. The electrically insulating shields 70 are preferably curved so that they may effectively cover the nonsputtered regions 58b of target 52b. Shields 70 are preferably formed from a metal and most preferably from 16 gauge stainless steel sheet. Each shield 70 should extend around the outer periphery over the nonsputtered regions 58b of target 52b so that the shield is immediately adjacent the target outer periphery, but spaced therefrom to avoid direct contact between the shield and target. This allows the target 52b to be rotated without binding or frictionally engaging shields 70 in the sputtering apparatus. Shields 70 are electrically isolated from target 52b and the rest of the sputtering apparatus by isolation pads 72 provided at each point of attachment of shield 70 to the sputtering apparatus or chamber. The material selected for use in forming isolation pads 72 should be electrically insulating, readily machinable, resistant to high temperatures, and exhibit little or no outgassing, especially when heated. Outgassing as used herein refers to a material's tendency to generate or expel gases or vapors over time. An example of a material suitable for isolation pad 72 is DELRIN, an acetal polymer available from Du Pont of Wilmington, Del. Numerous nonconducting plastic or other retainers or fasteners 74 may be used for affixing the shield 70 and pad 72 to the sputtering chamber or an insulating bonding material may be used.

Figure 23:
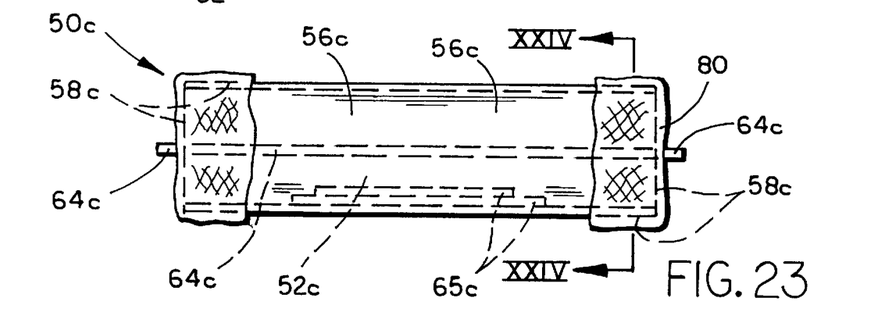
FIG. 23 is a side elevational view of a sixth embodiment of the present invention, namely, a cylindrical magnetron sputtering target in conjunction with a flexible insulating material.
Figure 24:
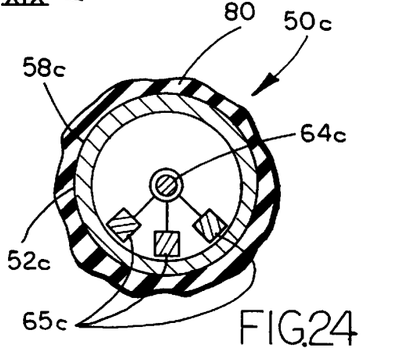
FIG. 24 is a cross section of the sputtering target of FIG. 23 taken along plane XXIV—XXIV.

FIG. 23 is a side elevational view of a sixth embodiment 50c of the present invention comprising a cylindrical, electrically conducting target 52c, having sputtered region 56c, and nonsputtered regions 58c, a plurality of magnets 65c arranged within the interior of the cylinder, a spindle 64c extending outward from one or both ends of the cylinder, and a flexible insulating material 80 wrapped around the nonsputtered regions 58c. The flexible insulating material 80 is preferably silica cloth available from McMaster Carr of Chicago, Ill. After wrapping the nonsputtered regions 58c with sufficient amounts of insulating material 80, nonconducting adhesive tape may be used to prevent insulating material 80 from unwrapping. The amount of insulating material 80 to be wrapped over nonsputtered regions 58c depends upon the degree of electrical insulation required to prevent sparking. However, such minimum thickness may be estimated in the same manner as the determination of thickness of insulating material layer 43a, 43b, and 43c. The flexible insulating material may optionally cover the flat ends of target cylinder 52c as well. FIG. 24 is a cross section of the sputtering target embodiment 50c illustrated in FIG. 23, taken along plane XXIV—XXIV. FIG. 24 particularly illustrates a typical configuration of magnets 65c.

The present invention may be utilized in or applied to a variety of sputtering processes. It is envisaged that the following aspects and combinations of sputtering: DC sputtering, RF sputtering, reactive sputtering, magnetron sputtering, ion beam sputtering, and others, may all benefit from the teachings of the present invention. The present invention is particularly directed toward silicon containing sputtering targets. Typically, silicon containing targets comprise at least 70% silicon, but it is envisaged that lesser amounts of silicon could also be utilized. Furthermore, the present invention is equally applicable to a host of sputtering processes in which a plurality of sputtering targets are used. In these instances, it has been found that the use of a plurality of sputtering targets often increases the rate at which substrates can be passed through the sputtering apparatus.

EXAMPLE 1

A planar magnetron target corresponding to the first embodiment 40a of the present invention was formed by plasma spraying a 6% aluminum/94% silicon target material, available from Cookson-Plasmaterials, Inc. of San Ramon, Calif., onto a copper backing plate cathode. An active target area of 4.75" by 14.875" was formed. The target was used in conjunction with a standard CPA 9900 sputter coater, made by Circuits Processing Apparatus, Inc. of Fremont, Calif. The erosion profile became visible once the target was run for some time. The nonsputtered regions were then machined away by milling such that material was removed up to 0.25" beyond the visible boundary on the sputtered region side. All target material in the nonsputtered regions was removed although this was not necessary. The regions where material was removed were then filled with a castable ceramic material such as PYROMAX castable/machinable ceramic, available from Aremco Products of Ossining, N.Y. Curing was performed at room temperature by covering the ceramic and target with plastic and waiting approximately eight hours. When finished, the target was mounted in the sputter coater and sputtered in pure oxygen, no sparking was observed in the nonsputtered regions.

EXAMPLE 2

A planar magnetron target corresponding to the third embodiment 40c of the present invention was formed by depositing the PYROMAX ceramic of Example 1 or No. 29 low expansion ceramic cement available from Sauereisen Cement Co. of Pittsburgh, Pa. onto the target surface of a conventional planar target in the regions of nonsputtering.

A metal form (the support material) matching the nonsputtered regions was cut, resulting in an inner oval-shaped piece and an outer piece. The metal forms were then coated with the castable ceramic described above and subsequently cured. Support arms were then attached which extended over the nonsputtered region of the target.

EXAMPLE 3

A cylindrical magnetron sputtering target corresponding to the fourth embodiment 50a of the present invention was formed, for use in an Airco C-MAG® 940 dual rotatable magnetron sputtering system, available from Airco Coating Technology of Fairfield, Calif. Cylindrical rings were machined from a 902 machinable ceramic material purchased from Cotronics, Inc. of Brooklyn, N.Y. The dimensions of the final cylindrical rings were 2" in length by 2.85" internal diameter by 0.25" wall thickness. These rings were positioned over the cylindrical target ends such that they extended less than 0.25" into the sputtered regions. The slight space between the target surface and inside diameter of the ceramic rings was filled by wrapping five mil thick KAPTON® foil (tape with no adhesive) around the cathode target, then sliding the ring over the foil until positioned properly to provide a friction fit.

Before the modifications of the fourth embodiment, it was found that a cylindrical silicon target sold by Airco Coating Technology of Fairfield, Calif., could be sputtered at 500 watts DC in pure oxygen for about 10 hours before sparking occurred. In accordance with the teachings of the fourth embodiment, the cylindrical target was removed from the chamber and the ceramic rings positioned over the nonsputtered (sparking) ends of the target. When the target was placed back into the sputtering system and the system operated, it was found that the system could be operated in excess of 6,000 watts with little or no sparking for several days of accumulated operation time. This extended operation time at such high power outputs has never been attained by the prior art to the knowledge of the present inventor.

EXAMPLE 4

A cylindrical magnetron sputtering target corresponding to the fifth embodiment 50b of the present invention was formed by positioning electrically isolated metallic shields in close proximity to the nonsputtered end regions of a conventional cylindrical sputtering target. In an Airco C-MAG® sputtering system (as in Example 3), semicircular metal shields were attached to the interior of the sputtering chamber. The minimum distance between a shield and the nonsputtered regions of the cylindrical target was about 3/16 inch. DELRIN shims were used to provide electrical isolation between the shields and the sputtering chamber. The use of this fifth embodiment reduced sparking significantly, and permitted the power to be increased to about 1,000 watts for use over several hours without significant sparking.

EXAMPLE 3

A cylindrical magnetron sputtering target corresponding to the sixth embodiment 50c of the present invention was formed by wrapping silica cloth over the nonsputtered ends of the target. Various lengths of 0.125" thick silica cloth such as that sold by McMaster-Carr of Chicago, Ill. were cut to a width of 2". The silica cloth was held in place by wrapping with KAPTON® adhesive tape. The KAPTON® tape was 0.25" wide, made by Fralock, Inc. of California. Two strips of KAPTON® tape were used for each target end wrapped with silica cloth, and were positioned approximately 0.75" from the inside and outside edges of the silica cloth. The use of the above embodiment permitted operation at 5,000 watts reliably for accumulated times in excess of 40 hours. Both the fourth embodiment 50a (ceramic rings) and sixth embodiment 50c (silica cloth) permitted magnetron sputtering at powers 5–10 times higher than could be used for prior art cylindrical targets.

Of course, it is understood that the foregoing merely notes preferred embodiments of the invention and that various changes and alterations can be made without departing from the spirit and broader aspects thereof as set forth in the appended claims, which are to be interpreted in accordance with the principles of patent law, including the Doctrine of Equivalents.

The embodiments of the invention in which an exclusive property or privilege is claimed are defined as follows:

1. A substantially nonsparking magnetron sputtering target having regions of sputtering and nonsputtering for a direct current sputtering process, comprising:

an electrically conducting magnetron target material for use in a magnetron sputtering process;

insulation means for electrically insulating said nonsputtering regions of said magnetron target from a sputtering gas plasma created during said magnetron sputtering process, said insulation means selected from the group consisting of 1) a substantially nonsputtering, electrically insulating material substituted for said nonsputtering regions of said target, and 2) a substantially nonsputtering, electrically insulating material covering said nonsputtering regions of said target which are exposed to said gas plasma during sputtering, said insulation means being of sufficient thickness to substantially prevent catastrophic sparking during sputtering; and a layer of support material over said coating of said electrically insulating material.

2. A substantially nonsparking magnetron sputtering target in accordance with claim 1 wherein said electrically insulating material is securely attached to said support material.

3. A substantially nonsparking magnetron sputtering target in accordance with claim 2 wherein said target further comprises:

at least one rigid mounting arm affixed to said support material residing in one nonsputtering region to said support material residing in another nonsputtering region.

4. A method of forming a substantially nonsparking, magnetron sputtering target for a direct current sputtering process comprising at least one layer of electrically conducting target material residing on a backing member for various sputtering applications, said method comprising:

preparing a surface of said backing member for contacting said target material;

depositing a sufficient amount of said target material upon said surface of said backing member wherein an exposed outer surface of said target material is formed;

defining nonsputtered regions on said exposed surface of said target material;

removing said target material from said nonsputtered regions of said exposed surface of said target material wherein regions of removal are formed in said nonsputtered regions; and depositing a quantity of a substantially, nonsputtering, electrically insulating material upon said regions of removal formed on said exposed surface of said target material, said nonsputtering, electrically insulating material having a thickness sufficient to substantially prevent catastrophic sparking when used in magnetron sputtering.

5. A substantially nonsparking magnetron sputtering target for a direct current, reactive magnetron sputtering process having regions of sputtering and nonsputtering, comprising:

an electrically conducting target material in the form of a cylinder; and a means for electrically insulating said nonsputtering regions of said target from a sputtering gas plasma created during said magnetron sputtering process including at least one curved, electrically isolated and conducting shield proximately covering said nonsputtering regions such that said shield is immediately adjacent but spaced from said target material, said target material extending continuously past said shield without a change in target material.

6. A substantially nonsparking magnetron sputtering target in accordance with claim 5 wherein said target material includes silicon.

7. A method of substantially reducing catastrophic sparking during sputtering of a magnetron target in a direct current, reactive sputtering process in the form of a cylinder in which a sputtering gas plasma is formed during operation, said magnetron target comprising at least one layer of electrically conducting target material having at least two sides one of which is exposed, said method comprising:

defining at least one nonsputtered region and at least one sputtered region on said exposed side of said magnetron target material layer, said one nonsputtered region and said one sputtered region separated by a boundary; and insulating said one nonsputtered region from said sputtering gas plasma by positioning at least one curved, electrically isolated shield in proximate relation to said nonsputtered regions of said magnetron target such that said shield is immediately adjacent but spaced from said magnetron target and said target material extends continuously past said shield without a change in target material.

8. A method of reducing catastrophic sparking during magnetron sputtering in accordance with claim 7 including performing said sputtering with a target material containing silicon.

9. A method of reducing catastrophic sparking during reactive direct current sputtering in accordance with claim 7 wherein said sputtering takes place in a sputtering apparatus comprising a sputtering chamber, a cathode formed by a cylindrical backing member, an anode, a substrate to be coated with a layer of target material during sputtering, a means for providing an electrical potential between said cathode and said anode, a means for maintaining a vacuum inside said sputtering chamber, and a supply of gas for said sputtering chamber, said electrically conducting target material contacting said cathode backing member at least in said sputtered region, said method further comprising:

achieving a vacuum within the interior of said sputtering chamber;

introducing a quantity of said gas into said interior of said sputtering chamber; and producing an electrical potential between said magnetron target and said anode sufficient to induce sputtering to said substrate from said target.

10. A method of reducing catastrophic sparking during reactive direct current magnetron sputtering in accordance with claim 9 including sputtering in the presence of oxygen gas and utilizing a silicon containing target.

* * * * *